(12) United States Patent
Xu et al.

(10) Patent No.: US 11,604,239 B1
(45) Date of Patent: Mar. 14, 2023

(54) THERMAL SHIELD OF MAGNETIC RESONANCE IMAGING MAGNET FOR LIMITING MAGNET GRADIENT INTERACTION

(71) Applicant: GE PRECISION HEALTHCARE LLC, Wauwatosa, WI (US)

(72) Inventors: Minfeng Xu, Ballston Lake, NY (US); Anbo Wu, Clifton Park, NY (US); Yihe Hua, Rexford, NY (US); Mark Ernest Vermilyea, Schenectady, NY (US); Thomas Kwok-Fah Foo, Clifton Park, NY (US); Paul St. Mark Shadforth Thompson, Stephentown, NY (US)

(73) Assignee: GE Precision Healthcare LLC, Wauwatosa, WI (US)

( * ) Notice: Subject to any disclaimer, the term of this patent is extended or adjusted under 35 U.S.C. 154(b) by 0 days.

(21) Appl. No.: 17/406,678

(22) Filed: Aug. 19, 2021

(51) Int. Cl.
    *G01R 33/385* (2006.01)
    *H01F 6/04* (2006.01)
    *G01R 33/3815* (2006.01)

(52) U.S. Cl.
    CPC ..... *G01R 33/3856* (2013.01); *G01R 33/3815* (2013.01); *G01R 33/3854* (2013.01); *H01F 6/04* (2013.01)

(58) Field of Classification Search
    CPC ............ G01R 33/3856; G01R 33/3815; G01R 33/3854; H01F 6/04
    See application file for complete search history.

(56) References Cited

U.S. PATENT DOCUMENTS

| | | | |
|---|---|---|---|
| 6,501,275 B1 | 12/2002 | Westphal | |
| 6,707,302 B2 | 3/2004 | Ries | |
| 7,514,928 B2 | 4/2009 | Westphal | |
| 8,410,772 B1 | 4/2013 | Potluri | |
| 2013/0157865 A1* | 6/2013 | Shen | G01R 33/56518 324/322 |

FOREIGN PATENT DOCUMENTS

| | | | |
|---|---|---|---|
| JP | H0521227 A | * | 1/1993 |
| JP | H05335137 A | * | 12/1993 |
| JP | H07142772 A | * | 6/1995 |
| JP | 2001167923 A | * | 6/2001 |

* cited by examiner

*Primary Examiner* — Daniel R Miller
(74) *Attorney, Agent, or Firm* — Fletcher Yoder P.C.

(57) ABSTRACT

A system for minimizing MGI in a superconducting magnet system of an MRI system includes a thermal shield having bi-metal material. The thermal shield is configured to be disposed about a cold mass of the superconducting magnet system, wherein the bi-metal material is configured to minimize MGI.

11 Claims, 12 Drawing Sheets

THERMAL SHIELD OF MAGNETIC RESONANCE IMAGING MAGNET FOR LIMITING MAGNET GRADIENT INTERACTION

STATEMENT REGARDING FEDERALLY SPONSORED RESEARCH & DEVELOPMENT

This invention was made with US Government support under contract number U01 EB026976 awarded by US Department of Health and Human Services National Institutes of Health. The Government has certain rights in the invention.

BACKGROUND

The subject matter disclosed herein relates to a superconducting magnet system for a magnetic resonance imaging (MRI) system and, more particularly, to a thermal shield of the superconducting magnet system for limiting magnet gradient interaction (MGI).

Non-invasive imaging technologies allow images of the internal structures or features of a patient/object to be obtained without performing an invasive procedure on the patient/object. In particular, such non-invasive imaging technologies rely on various physical principles (such as the differential transmission of X-rays through a target volume, the reflection of acoustic waves within the volume, the paramagnetic properties of different tissues and materials within the volume, the breakdown of targeted radionuclides within the body, and so forth) to acquire data and to construct images or otherwise represent the observed internal features of the patient/object.

During MM, when a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field B1) which is in the x-y plane and which is near the Larmor frequency, the net aligned moment, or "longitudinal magnetization", $M_z$, may be rotated, or "tipped", into the x-y plane to produce a net transverse magnetic moment, $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradient fields vary according to the particular localization method being used. The resulting set of received nuclear magnetic resonance (NMR) signals are digitized and processed to reconstruct the image using one of many well-known reconstruction techniques.

MRI systems may utilize superconducting magnets. MGI (magnet-gradient interaction, i.e., electromagnetic and electromechanical interaction between the magnetic gradient field and the main magnet) poses a challenge when utilizing high field (3 Tesla (T) or greater) MRI magnets. During normal MRI operation, the gradient coil pulses and a leakage magnetic field generated by the gradient coil at the thermal shield location induces eddy current in the shield. This is due to the thermal shield typically being made of good thermally conductive material (e.g., aluminum), which is also a good electrically conductive material. The eddy current interacts with the magnetic field at the location of the thermal shield and causes mechanical vibration. The vibration of electrically conductive thermal shield will cut the magnetic flux of strong main magnet, and further induce motional eddy currents. The vibrating (motional) current elements in the thermal shield irradiates time-varying electromagnetic (EM) fields to the cold mass. The time-varying EM fields result in eddy current heating in the cold mass since the cold mass is typically made of electrically conductive materials (e.g., copper, superconductors, aluminum, etc.). The heating could be excessive (greater than the cryogenic system capacity to remove heat) and could cause a magnet to quench. This MGI effect is more pronounced when the magnetic field is higher. Thus, it becomes a major technical concern when designing a high field (e.g., 3 T) or ultra-high field (e.g., 7 T or greater) MRI magnet.

BRIEF DESCRIPTION

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a system for minimizing MGI in a superconducting magnet system of an MRI system is provided. The system includes a thermal shield having bi-metal material and configured to be disposed about a cold mass of the superconducting magnet system, wherein the bi-metal material is configured to minimize MGI.

In another embodiment, a superconducting magnet system for an MRI system is provided. The system includes a cold mass. The cold mass includes a coil support structure having a body and a superconducting magnet having a superconducting coil disposed about the body of the coil support structure. The system also includes a thermal shield encompassing the cold mass, wherein the thermal shield includes a bi-metal material configured to minimize MGI.

In a further embodiment, an MRI system is provided. The system includes multiple gradient coils. The system also includes a cold mass and a thermal shield encompassing the cold mass, wherein the thermal shield includes a bi-metal material configured to minimize MGI with the gradient coils.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present subject matter, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

While aspects of the following discussion are provided in the context of medical imaging, it should be appreciated that the disclosed techniques are not limited to such medical contexts. Indeed, the provision of examples and explanations in such a medical context is only to facilitate explanation by providing instances of real-world implementations and applications. However, the disclosed techniques may also be utilized in other contexts, such as image reconstruction for non-destructive inspection of manufactured parts or goods (i.e., quality control or quality review applications), and/or the non-invasive inspection of packages, boxes, luggage, and so forth (i.e., security or screening applications). In general, the disclosed techniques may be useful in any imaging or screening context or image processing or photography field where a set or type of acquired data undergoes a reconstruction process to generate an image or volume.

The present disclosure provides a thermal shield for a superconducting magnet system of Mill system made of a bi-metal material (of at least two different metallic materials but could also refer to having more than two metallic material layers) to minimize the MGI (and, consequently, fast switching (time-varying) magnetic gradient fields). In particular, the thermal shield is configured to be disposed about or encompass a cold mass (e.g., coil support, superconducting magnet or magnet coils, helium vessel, etc.) of the superconducting magnet system. The thermal shield includes a first metal layer and a second metal layer made of different metal materials, wherein the first metal layer (e.g., aluminum or copper) is thermally more conductive than the second metal layer and the second metal layer (e.g., stainless steel or titanium) is mechanically stiffer than the first metal layer. The second metal layer is configured to minimize mechanical vibration in the thermal shield due to eddy current induction and to minimize heat generated in the cold mass of the superconducting magnet system. Thus, magnet overheating and quenching are avoided (especially for high field Mill magnets (3 T or above)). The disclosed embodiments minimize the MGI in a more cost-effective manner (i.e., without increasing the thickness of the conventional thermal shield and coil diameter of superconducting wires which would increase costs). It is noted that the techniques disclosed do not preclude having a plurality of metal layers where there is at least two layers of differing material and electrical properties. As such, the thermal shield can also be of a plurality of different metal layers, each with differing material and electrical properties.

Figure 1:
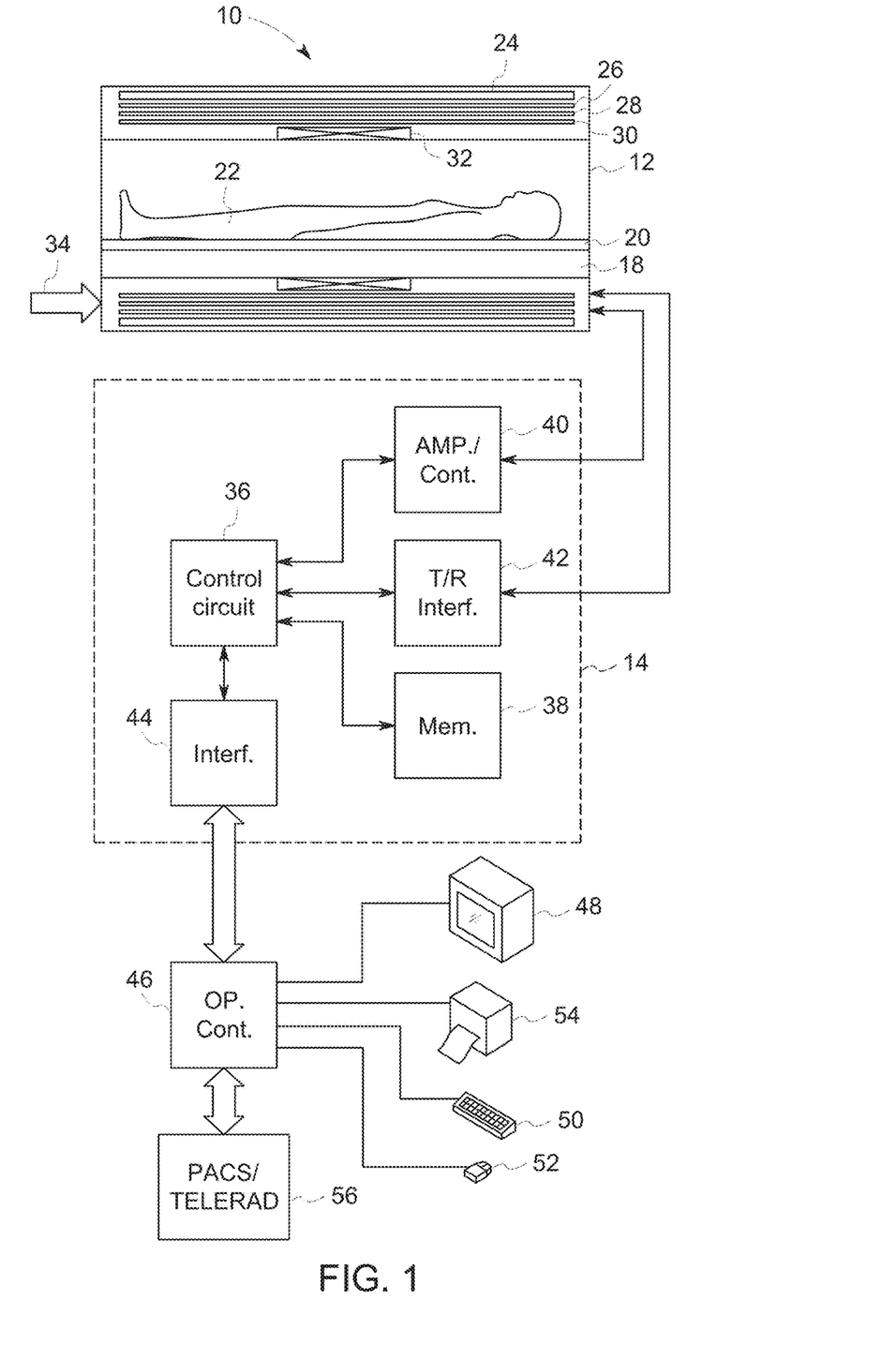
FIG. 1 illustrates an embodiment of a magnetic resonance imaging (MRI) system suitable for use with the disclosed technique.

Turning now to the drawings, and referring first to FIG. 1, a magnetic resonance imaging (MM) system 10 is illustrated diagrammatically as including a scanner 12, scanner control circuitry 14, and system control circuitry 16. While MM system 10 may include any suitable Mill scanner or detector, in the illustrated embodiment the system includes a full body scanner comprising a patient bore 18 into which a table 20 may be positioned to place a patient 22 in a desired position for scanning.

Scanner 12 includes a series of associated coils for producing controlled magnetic fields, for generating radiofrequency excitation pulses, and for detecting emissions from gyromagnetic material within the patient in response to such pulses. In the diagrammatical view of FIG. 1, a primary magnet coil 24 (e.g., superconducting magnet coil) is provided for generating a primary magnetic field, $B_0$, generally aligned with patient bore 18. In certain embodiments, $B_0$ fields on the order of 3 T to 7 T are contemplated, but fields higher than 7 T and as low as a fraction of a Tesla are also contemplated. A series of gradient coils 26, 28 and 30 (e.g., magnetic gradient field coils) are grouped in a coil assembly for generating controlled magnetic gradient fields during examination sequences as described more fully below. A radiofrequency coil 32 is provided for generating radiofrequency pulses for exciting the gyromagnetic material. In the embodiment illustrated in FIG. 1, coil 32 also serves as a receiving coil. Thus, radiofrequency (RF) coil 32 may be coupled with driving and receiving circuitry in passive and active modes for receiving emissions from the gyromagnetic material and for applying radiofrequency excitation pulses, respectively. Alternatively, various configurations of receiving coils may be provided separate from RF coil 32. Such coils may include structures specifically adapted for target anatomies, such as head coil assemblies, and so forth. Moreover, receiving coils may be provided in any suitable physical configuration, including phased array coils, and so forth.

In a present configuration, the magnet gradient field coils 26, 28 and 30 have different physical configurations adapted to their function in the imaging system 10. As will be appreciated by those skilled in the art, the coils are comprised of conductive wires, bars or plates which are wound or cut to form a coil structure which generates a gradient field upon application of control pulses as described below. The placement of the coils within the gradient coil assembly may be done in several different orders, but in the present embodiment, a Z-axis coil is positioned at an innermost location, and is formed generally as a solenoid-like structure which has relatively little impact on the RF magnetic field. Thus, in the illustrated embodiment, gradient coil 30 is the Z-axis solenoid coil, while coils 26 and 28 are the transverse Y-axis and X-axis coils, respectively.

The coils of scanner 12 are controlled by external circuitry to generate desired fields and pulses, and to read signals in a controlled manner. As will be appreciated by those skilled in the art, when the material, typically bound in tissues of the patient, is subjected to the primary field, magnetic moments of the nuclei in the tissue partially align with the field. While a net magnetic moment is produced in the direction of the polarizing field, the randomly oriented components of the moment in a perpendicular plane generally cancel one another. During an examination sequence, an RF frequency pulse is generated at or near the Larmor frequency of the material of interest, resulting in rotation of the net aligned moment to produce a net transverse magnetic moment. This transverse magnetic moment precesses around the main magnetic field direction, emitting RF signals that are detected by the scanner and processed for reconstruction of the desired image.

Gradient coils 26, 28 and 30 serve to generate precisely controlled magnetic fields, the strength of which vary over a predefined field of view, typically with positive and negative polarity. When each coil is energized with known electric current, the resulting magnetic field gradient is superimposed over the primary field and produces a desirably linear variation in the Z-axis component of the magnetic field strength across the field of view. The gradient coil for each axis generates a linear magnetic field gradient in the direction of that axis. As such, the spatially-varying z-directed magnetic field varies linearly along the direction of the gradient coil axis. The three coils have mutually orthogonal axes for the direction of their variation, enabling a linear field gradient to be imposed in an arbitrary direction with an appropriate combination of the three gradient coils.

The pulsed gradient fields perform various functions integral to the imaging process. Some of these functions are slice selection, frequency encoding and phase encoding. These functions can be applied along the X-, Y- and Z-axis of the original coordinate system or along other axes determined by combinations of pulsed currents applied to the individual field coils.

The slice select gradient determines a slab or cross-section of tissue or anatomy to be imaged in the patient. The slice select gradient field may be applied simultaneously with a frequency selective RF pulse to excite a known volume of spins within a desired slice that precess at the frequencies equal to the excitation bandwidth of the RF pulse. The slice thickness is determined by the bandwidth of the RF pulse and the gradient strength across the field of view.

The frequency encoding gradient is also known as the readout gradient and is usually applied in a direction perpendicular to the slice select gradient. The frequency encoding gradient encodes positional information of spins with the plane excited by the RF pulse. In general, the frequency encoding gradient waveforms comprises of a dephasing lobe that dephases the spins, and a readout gradient lobe that rephases the spins at the center of the readout gradient waveform to form an echo. Spins with a nuclear magnetic moment encoded with a spatially varying phase (as they precess at different frequencies) according to their spatial position along the gradient field. By Fourier transformation, acquired signals may be analyzed to identify their location in the selected slice by virtue of the frequency encoding.

Finally, the phase encode gradient is generally applied before the readout gradient and after the slice select gradient. Localization of spins in the gyromagnetic material in the phase encode direction is accomplished by sequentially inducing variations in phase of the precessing protons of the material using slightly different gradient amplitudes that are sequentially applied during the data acquisition sequence. The phase encode gradient permits phase differences to be created among the spins of the material in accordance with their position in the phase encode direction, similar in principle to the phase accumulated by spins in the readout gradient waveform at different time points.

As will be appreciated by those skilled in the art, a great number of variations may be devised for pulse sequences employing the exemplary gradient pulse functions described above as well as other gradient pulse functions not explicitly described here. Moreover, adaptations in the pulse sequences may be made to appropriately orient both the selected slice and the frequency and phase encoding to excite the desired material and to acquire resulting MR signals for processing.

The coils of scanner 12 are controlled by scanner control circuitry 14 to generate the desired magnetic field and radiofrequency pulses. In the diagrammatical view of FIG. 1, control circuitry 14 thus includes a control circuit 36 for commanding the pulse sequences employed during the examinations, and for processing received signals. Control circuit 36 may include any suitable programmable logic device, such as a CPU or digital signal processor of a general purpose or application-specific computer. Control circuit 36 further includes memory circuitry 38, such as volatile and non-volatile memory devices for storing physical and logical axis configuration parameters, examination pulse sequence descriptions, acquired image data, programming routines, and so forth, used during the examination sequences implemented by the scanner.

Interface between the control circuit 36 and the coils of scanner 12 is managed by amplification and control circuitry 40 and by transmission and receive interface circuitry 42. Circuitry 40 includes amplifiers for each gradient field coil to supply drive current to the field coils in response to control signals from control circuit 36. Interface circuitry 42 includes additional amplification circuitry for driving RF coil 32. Moreover, where the RF coil serves both to emit the radiofrequency excitation pulses and to receive MR signals, circuitry 42 will typically include a switching device for toggling the RF coil between active or transmitting mode, and passive or receiving mode. A power supply, denoted generally by reference numeral 34 in FIG. 1, is provided for energizing the primary magnet 24. Finally, circuitry 14 includes interface components 44 for exchanging configuration and image data with system control circuitry 16. It should be noted that, while in the present description reference is made to a horizontal cylindrical bore imaging system employing a superconducting primary field magnet assembly, the present technique may be applied to various other configurations, such as scanners employing vertical fields generated by superconducting magnets, permanent magnets, electromagnets or combinations of these means.

System control circuitry 16 may include a wide range of devices for facilitating interface between an operator or radiologist and scanner 12 via scanner control circuitry 14. In the illustrated embodiment, for example, an operator controller 46 is provided in the form of a computer workstation employing a general purpose or application-specific computer. The station also typically includes memory circuitry for storing examination pulse sequence descriptions, examination protocols, user and patient data, image data, both raw and processed, and so forth. The station may further include various interface and peripheral drivers for receiving and exchanging data with local and remote devices. In the illustrated embodiment, such devices include a conventional computer keyboard 50 and an alternative input device such as a mouse 52. A printer 54 is provided for generating hard copy output of documents and images reconstructed from the acquired data. A computer monitor 48 is provided for facilitating operator interface. In addition, system 10 may include various local and remote image access and examination control devices, represented generally by reference numeral 56 in FIG. 1. Such devices may include picture archiving and communication systems, teleradiology systems, and the like.

Figure 2:
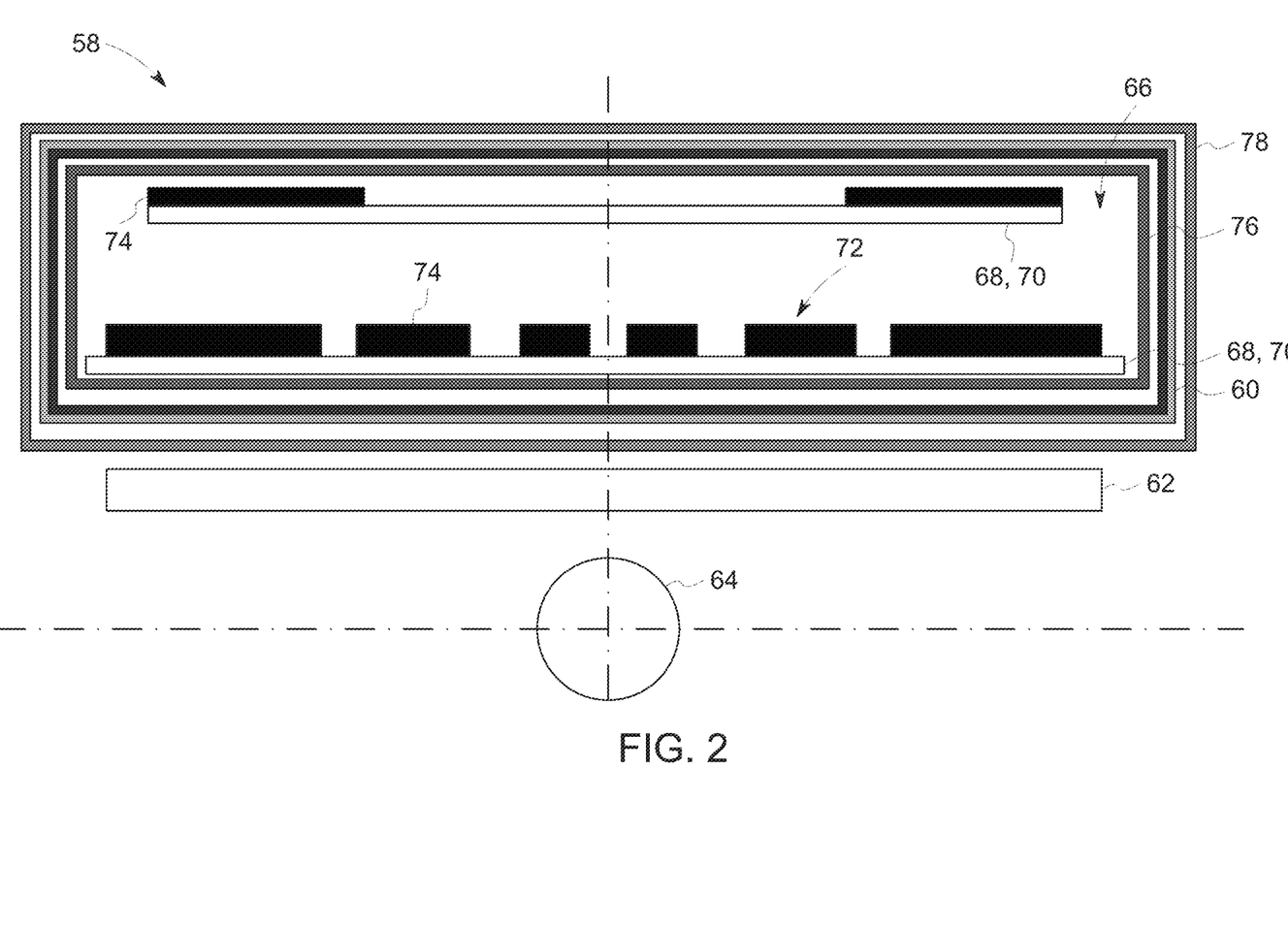
FIG. 2 is a schematic diagram (e.g., cross-section) of a superconducting magnet system having a bi-metal thermal shield, in accordance with aspects of the present disclosure.

As described more fully below, the present technique includes providing a bi-metal thermal shield for a superconducting magnet system of an MRI system to minimize the MGI. FIG. 2 is a schematic diagram (e.g., cross-section) of a superconducting magnet system 58 having a bi-metal thermal shield 60. As depicted, the superconducting magnet system 58 is disposed adjacent to a gradient coil 62 and an imaging volume 64. The superconducting magnet system 58 includes a cold mass 66. The cold mass 66 includes a magnet coil support structure 68 (having a body 70) and a superconducting magnet 72 that includes a plurality of superconducting magnet coils 74 disposed (e.g., wound) about the body 70 of the magnet coil support structure 68. The cold mass 66 also includes a helium vessel 76 disposed about (e.g., encompassing or enclosing) the magnet coil support structure 68 and the superconducting magnet 72. Liquid helium contained in the helium vessel 76 provides cooling for the superconducting magnet 72 at a low temperature for superconducting operations as will be understood by those skilled in the art. In particular, the liquid helium maintains the superconducting magnet 72 at approximately and/or substantially at the liquid helium temperature of about 4.2 Kelvin (K). In certain embodiments, a conventional helium vessel is not needed and the superconducting magnet 72 is cooled by conduction-cooling or thermosiphon cooling. A vacuum vessel 78 is disposed about (e.g., encompassing or enclosing) both the thermal shield 60 and the cold mass 66. The vacuum vessel 78 provides a vacuum environment to reduce convection heat load into the superconducting coils. The thermal shield 60 is disposed between the helium vessel 76 and the vacuum vessel 78. In certain embodiments, as described in greater detail below, the thermal shield 60 may include a tube (e.g., inner tube) flanked by a pair of flanges.

Figure 3:
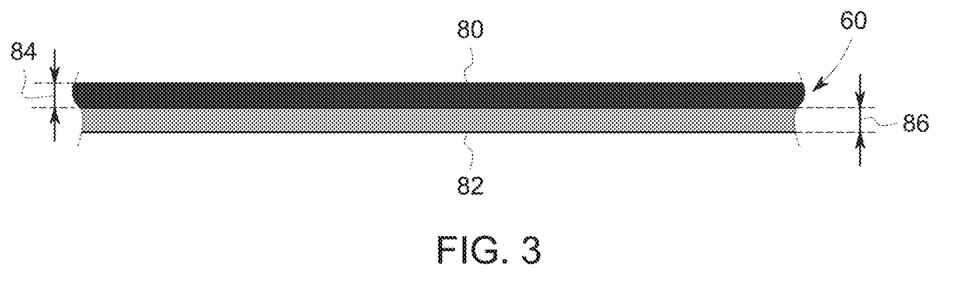
FIG. 3 is a schematic diagram of a portion of the bi-metal thermal shield of FIG. 2 (e.g., having two layers), in accordance with aspects of the present disclosure.

As noted above, the thermal shield 60 is made of bi-metal material that minimizes MGI between the superconducting magnet system 58 and the gradient coil 62. In particular, as shown in FIG. 3, the thermal shield 60 includes a first metal layer 80 and a second metal layer 82 made of different metal materials, wherein the first metal layer 80 is thermally more conductive than the second metal layer 82 and the second metal layer 82 is mechanically stiffer than the first metal layer 82. In certain embodiments, the first metal layer 80 may be made of aluminum or copper. In certain embodiments, the second metal layer 82 may be made of stainless steel or titanium. The thermally conductive material of the first metal layer 80 functions as a regular thermal shield. The second metal layer 82 stiffens the thermal shield 60 to resist or minimize mechanical vibration due to eddy current induction. Minimizing the mechanical vibration also minimizes the heat generated in the cold mass 66 of the superconducting magnet system 58. In certain embodiments, a thickness 84 of the first metal layer 80 and a thickness 86 of the second metal layer 82 may be the same. In certain embodiments, the thickness 84 of the first metal layer 80 may be greater than the thickness 86 of the second metal layer 82. In certain embodiments, the thickness 86 of the second metal layer 82 may be greater than the thickness 84 of the first metal layer 80.

Utilization of the second metal layer 82 made of a mechanically stiffer material avoids having to increase the thickness of a conventional thermal shield made of only a thermally conductive material to a desired stiffness level. Increasing the thickness of a conventional thermal shield would take up precious radial space between the vacuum vessel and the cold mass. In addition, a thicker conventional thermal shield would result in a larger superconductor coil diameter and, thus, increase the cost of the superconducting wires. Thus, utilizing the second metal layer 82 made of a mechanically stiffer material provides a more cost-effective technique for minimizing MGI.

Figure 4:
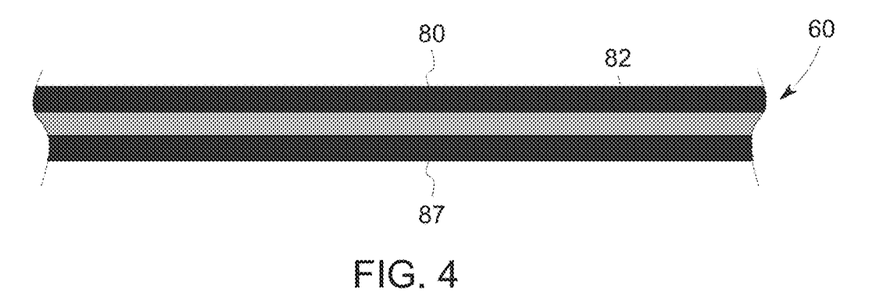
FIG. 4 is a schematic diagram of a portion of the bi-metal thermal shield of FIG. 2 (e.g., having three layers in a first arrangement), in accordance with aspects of the present disclosure.
Figure 5:
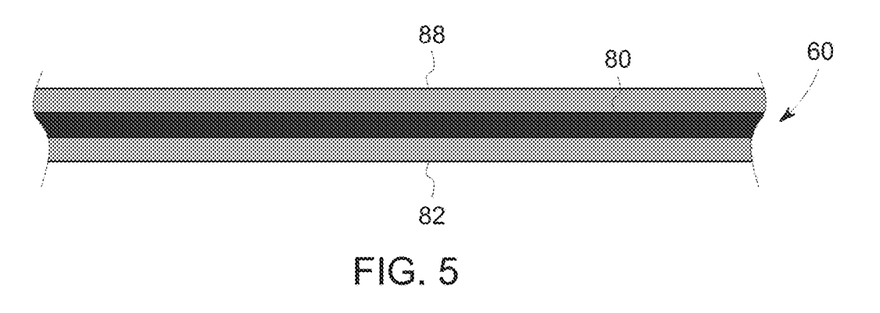
FIG. 5 is a schematic diagram of a portion of the bi-metal thermal shield of FIG. 2 (e.g., having three layers in a second arrangement), in accordance with aspects of the present disclosure.

In certain embodiments, the thermal shield 60 may be made of more than two metal layers. FIGS. 4 and 5 depict the thermal shield 60 having three metal layers in different arrangements. As depicted in FIG. 4, the thermal shield 60 includes the first metal layer 80 and the second metal layer 82 as described in FIG. 3. In addition, the thermal shield 60 in FIG. 4 includes a third metal layer 87. The third metal layer 87 is made of the same thermally conductive material (e.g., aluminum or copper) as the first metal layer 80. As depicted in FIG. 4, the second metal layer 82 is disposed (e.g., sandwiched) between the first metal layer 80 and the third metal layer 87. This configuration may enhance thermal conductivity.

As depicted in FIG. 5, the thermal shield 60 includes the first metal layer 80 and the second metal layer 82 as described in FIG. 3. In addition, the thermal shield 60 in FIG. 5 includes a third metal layer 88. The third metal layer 88 is made of the same mechanically stiff material (e.g., stainless steel or titanium) as the second metal layer 82. As depicted in FIG. 5, the first metal layer 80 is disposed (e.g., sandwiched) between the second metal layer 82 and the third metal layer 88. This configuration may enhance mechanical stiffness.

Figure 6:
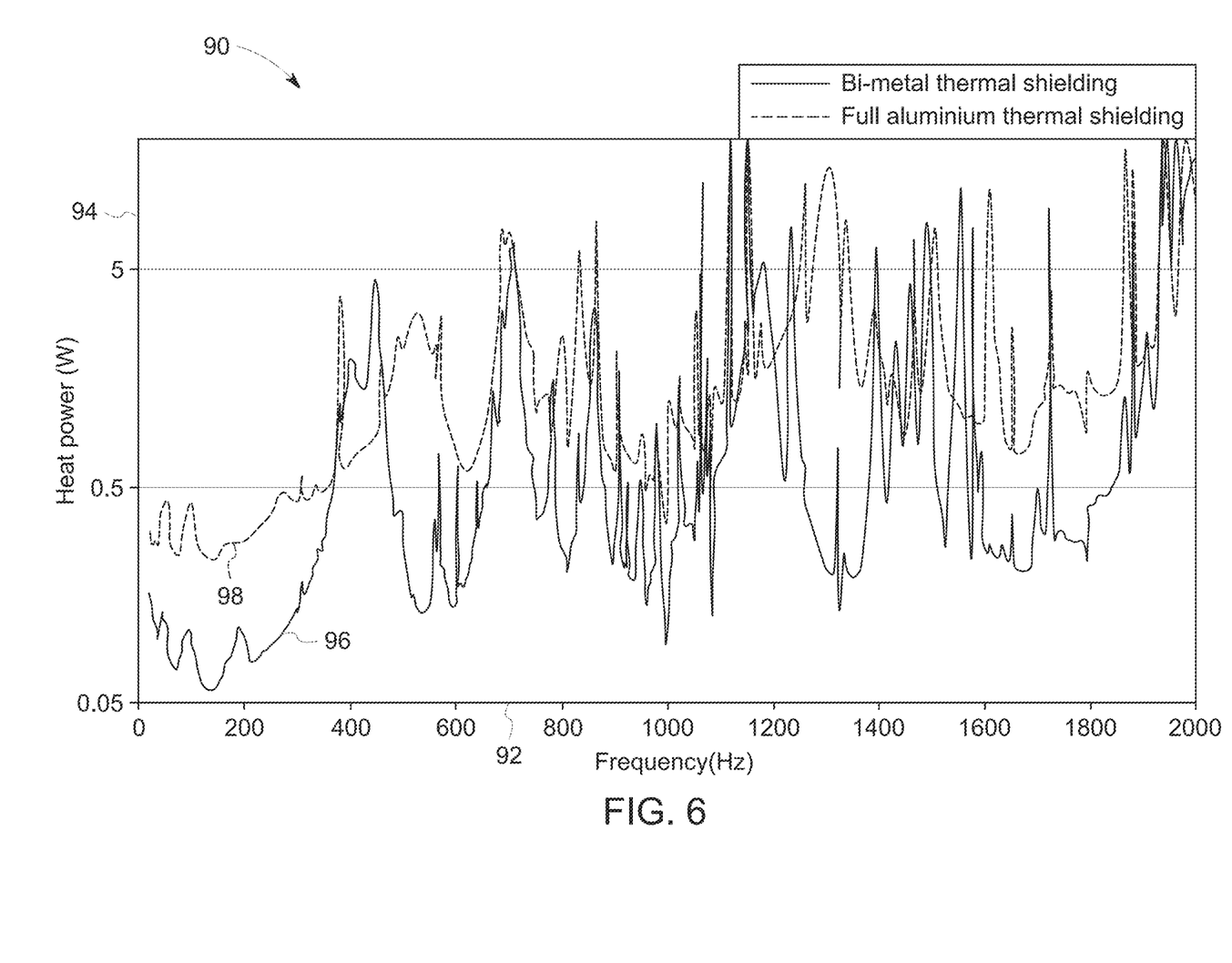
FIG. 6 is a representation of a graph illustrating heat generation over a frequency range for a conventional thermal shield versus a bi-metal thermal shield, in accordance with aspects of the present disclosure.
Figure 7:
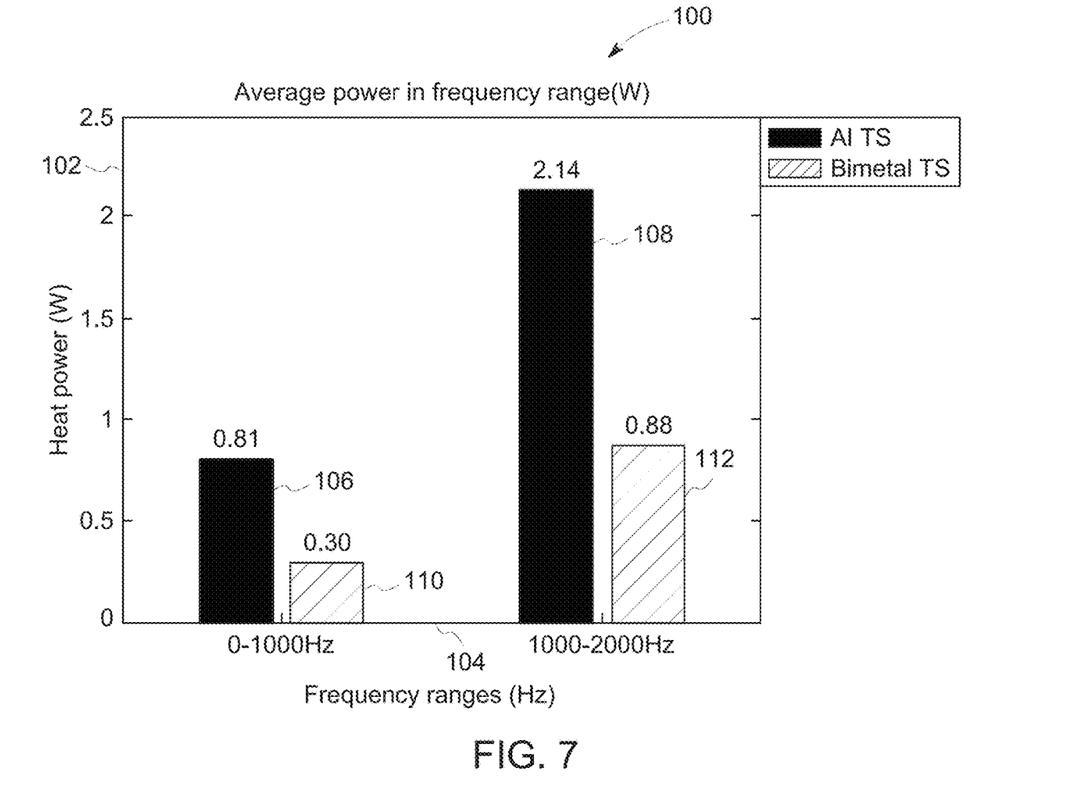
FIG. 7 is a representation of a graph illustrating average power from heat generation in different frequency ranges for the conventional thermal shield versus the bi-metal thermal shield from the data in the graph in FIG. 6, in accordance with aspects of the present disclosure.

As mentioned above, the bi-metal material of the thermal shield reduces heat generated in the cold mass of a superconducting magnet system. FIG. 6 is a representation of a graph 90 for illustrating heat generation over a frequency range (e.g., approximately 0 to 2000 Hertz (Hz)) for a conventional thermal shield versus a bi-metal thermal shield. The graph 90 includes an X-axis 92 representing frequency (e.g., in Hz) and a Y-axis 94 representing heat power (e.g., in watts (W)). Plot 96 (shown as a solid line) represents the heat power generated over the frequency range when utilizing a bi-metal thermal shield as described above. Plot 98 (shown as a dashed line) represents the heat power generated over the frequency range when utilizing a conventional (e.g., full aluminum) thermal shield. The results in the graph 90 are summarized in a bar graph 100 in FIG. 7 illustrating the average power from heat in different frequency ranges (e.g., 0 to 1000 Hz and 1000 to 2000 Hz). The Y-axis 102 represents the average heat power (e.g., in W) and the X-axis 104 includes the frequency ranges (e.g., in Hz). The solid bars 106, 108 represent the conventional (e.g., full aluminum) thermal shield and the hatched bars 110, 112 represent the bi-metal thermal shield. As depicted in the graphs 90, 100, the bi-metal thermal shield minimizes heat generation over the frequency range 0 to 2000 Hz compared to the conventional thermal shield.

Figure 8:
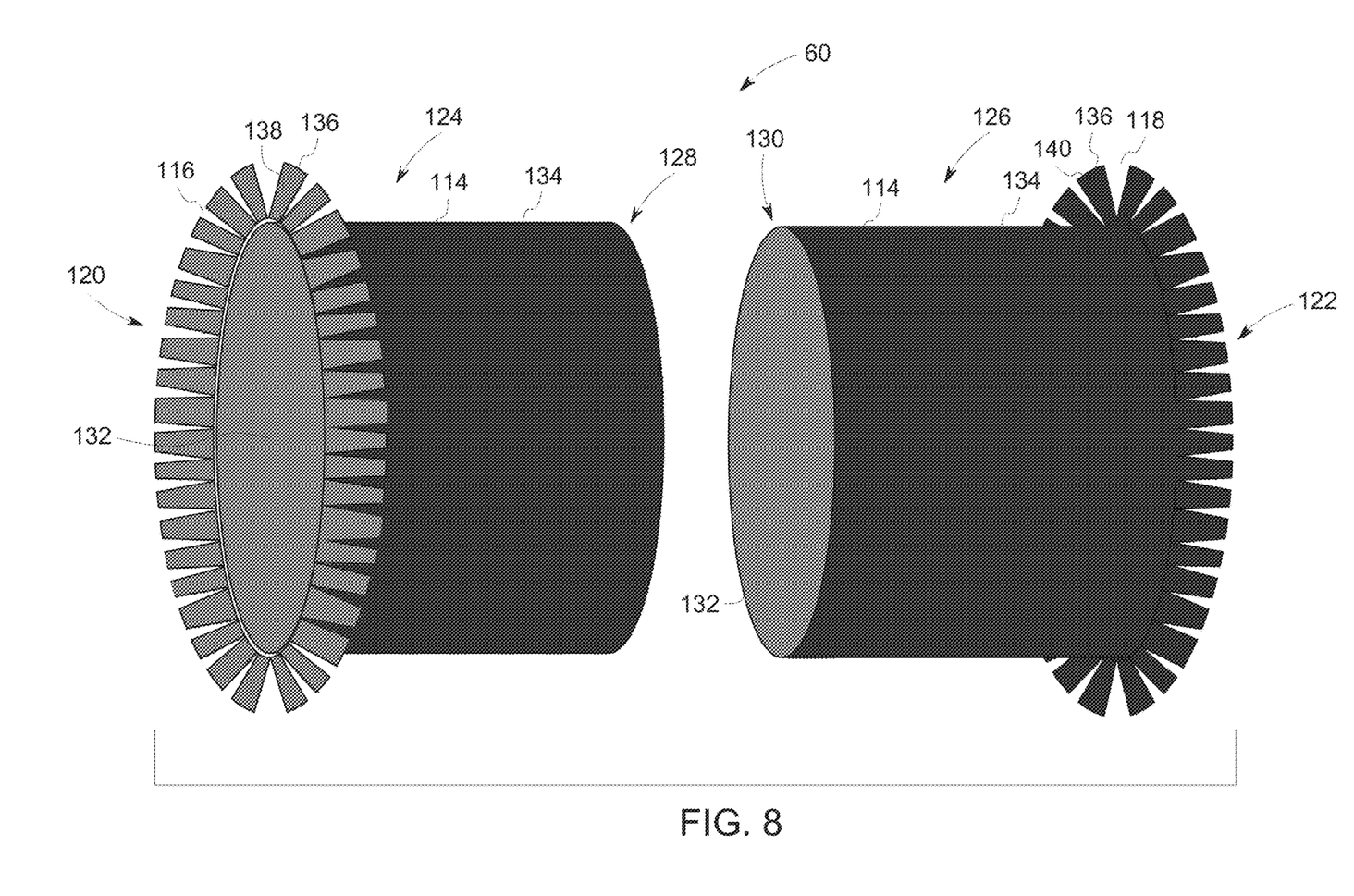
FIG. 8 is a perspective view of a portion of a bi-metal thermal shield (e.g., having tube portions with flared flanges), in accordance with aspects of the present disclosure.
Figure 9:
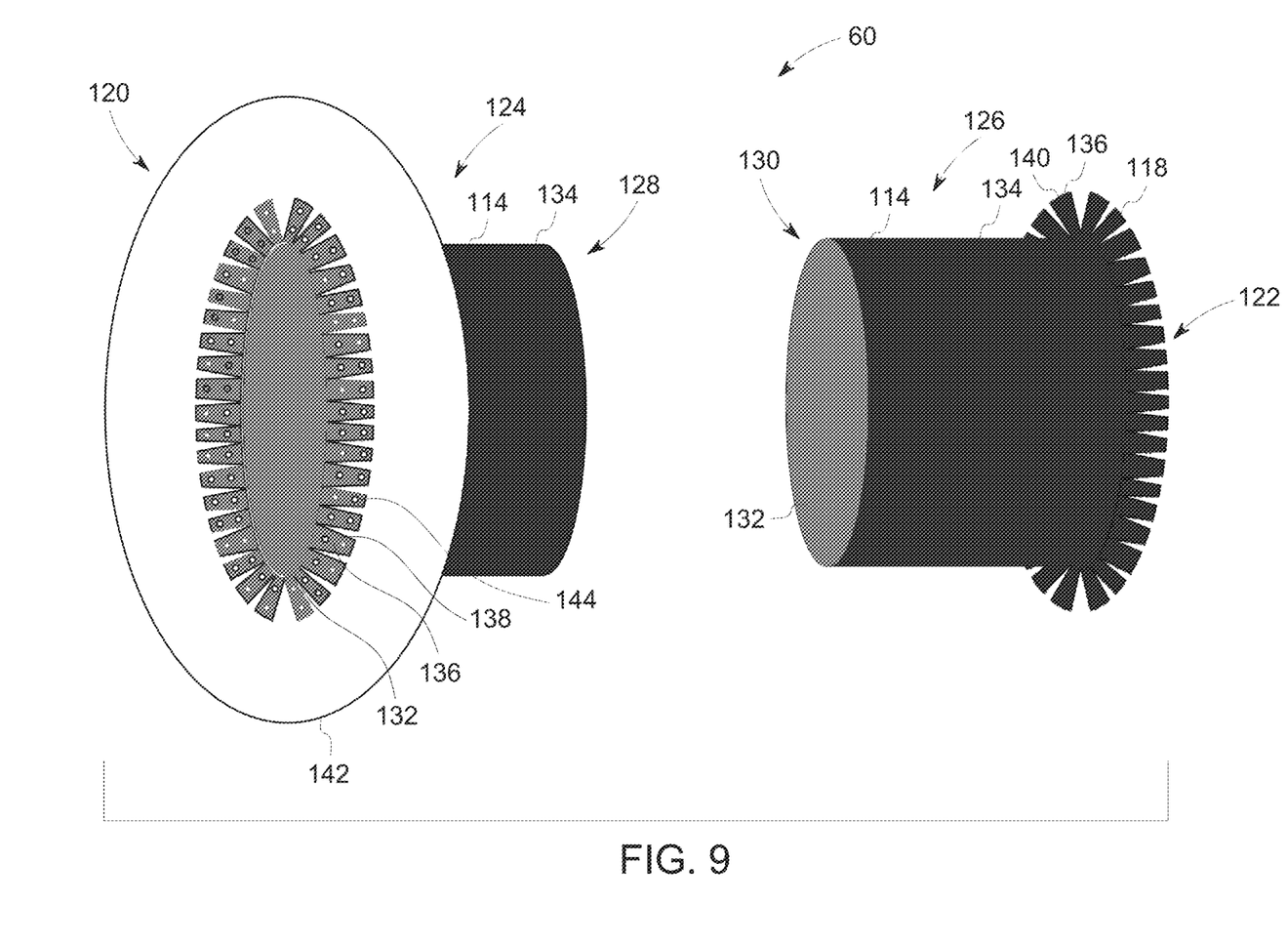
FIG. 9 is a perspective view of the portion of the bi-metal thermal shield of FIG. 8 coupled to a thermal shield flange (e.g., on an inside of the flared flange), in accordance with aspects of the present disclosure.

FIGS. 8-19 depict different views of ways the bi-metal thermal shield 60 may be constructed or fabricated. FIG. 8 is a perspective view of the bi-metal thermal shield 60. As depicted in FIG. 8, the bi-metal thermal shield 60 includes a tube 114 (e.g., inner tube) having a pair of flanges 116, 118 (e.g., flared flanges) on the longitudinal ends 120, 122 of the tube 114. The tube 114 is configured to be disposed about the cold mass of the superconducting magnet. The flanges 116, 118 are configured to be coupled to respective thermal shield flanges. In certain embodiments, during construction of the thermal shield 60, the tube 114 may initially consists of two portions 124, 126. Upon coupling the flanges 116, 118 to respective thermal shield flanges, ends 128 and 130 of the portions 124, 126 of the tube 114 are coupled (e.g., welded) together. The weld seam may be covered with an aluminum taper for thermal conductivity and emissivity. As depicted in FIGS. 8 and 9, an innermost surface 132 of the tube 114 is made of the more mechanically stiff layer (e.g., metal layer 82 in FIG. 3 made of stainless steel or titanium) and the outermost surface 134 of the tube 114 is made of the more thermally conductive layer (e.g., metal layer 80 in FIG. 3 made of copper or aluminum). The flanges 116, 118 include circumferentially spaced (e.g. relative to a longitudinal axis of the tube 114) portions 136 made of the bi-metal material. Each portion 136 includes a first surface 138 that faces away from the tube 114 and a second surface 140 opposite the first surface 138 that faces toward the tube 114. As depicted, the first surface 138 is made of the more mechanically stiff layer (e.g., metal layer 82 in FIG. 3 made of stainless steel or titanium) and the second surface 140 is made of the more thermally conductive layer (e.g., metal layer 80 in FIG. 3 made of copper or aluminum).

Figure 10:
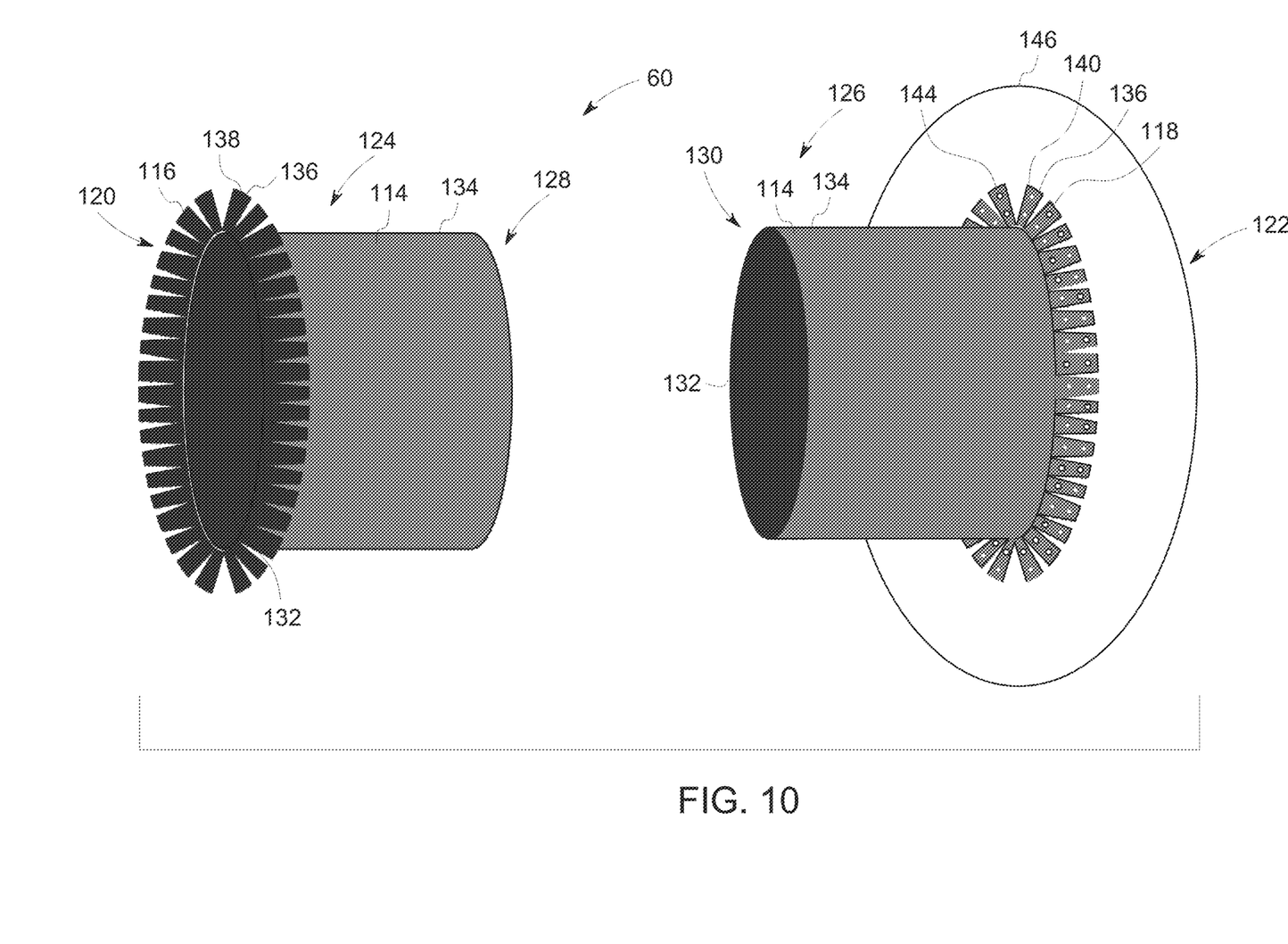
FIG. 10 is a perspective view of the portion of the bi-metal thermal shield of FIG. 8 coupled to a thermal shield flange (e.g., on an outside of the flared flange), in accordance with aspects of the present disclosure.

The portions 124 and 126 may be coupled to the thermal shield flanges in a couple of different arrangements. As depicted in FIG. 9, a thermal shield flange 142 (e.g., made of a thermally conductive material such as aluminum) is disposed about the inner tube 114 of the portion 124 of the thermal shield 60 so that surface 140 of the portions 136 of the flange 116 directly interfaces with the thermal shield flange 142 (i.e., coupled to an inside of the flared flange 116). The portions 136 are coupled to the thermal shield flange 142 via rivets or other fasteners 144 with Stycast2850FT epoxy (or other thermally conductive epoxy-) or indium interfaces for thermal contact. Similarly, the portion 126 of the inner tube 114 may be coupled to a thermal shield flange. As depicted in FIG. 10, a thermal shield flange 146 (e.g., made of a thermally conductive material such as aluminum) is disposed about the inner tube 114 of the portion 126 of the thermal shield 60 so that surface 138 of the portions 136 of the flange 118 directly interface with the thermal shield flange 146 (i.e., coupled to an outside of the flared flange 118). The portions 136 are coupled to the thermal shield flange 146 via rivets or other fasteners 144 with Stycast2850FT epoxy or indium interfaces for thermal contact. Similarly, the portion 124 of the inner tube 114 may be coupled to a thermal shield flange. As depicted in FIG. 10, the surfaces 134 and 140 may be made of the more mechanically stiff layer (e.g., metal layer 82 in FIG. 3 made of stainless steel or titanium) and the surfaces 132 and 138 made of the more thermally conductive layer (e.g., metal layer 80 in FIG. 3 made of copper or aluminum).

Figure 11:
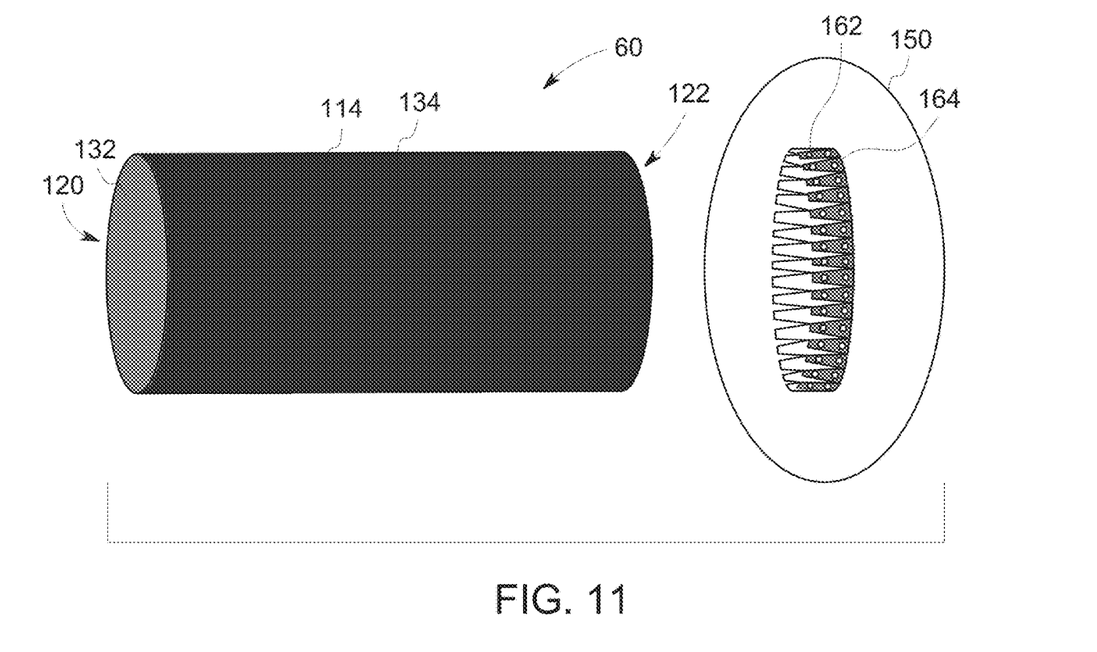
FIG. 11 is a perspective view of a portion of a bi-metal thermal shield (e.g., having a tube without flared flanges), in accordance with aspects of the present disclosure.
Figure 12:
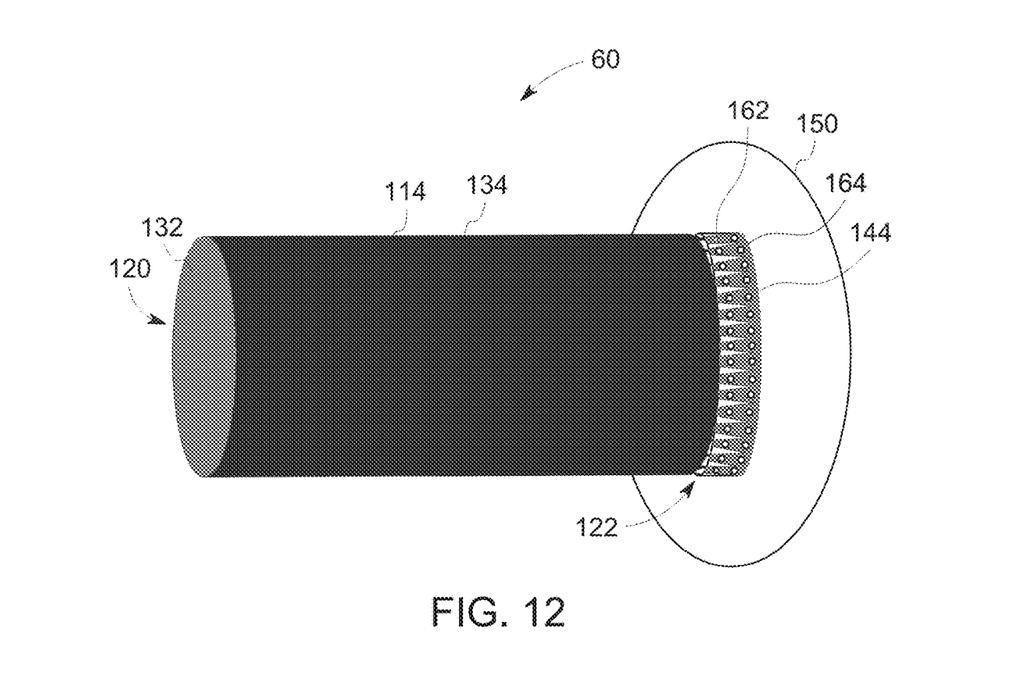
FIG. 12 is a perspective view of the portion the bi-metal thermal shield of FIG. 11 (e.g., having a connector of thermal shield flange to an outside of the tube), in accordance with aspects of the present disclosure.

FIG. 11 is a perspective view of a portion of the bi-metal thermal shield 60 (e.g., having the tube 114 without flared flanges). As depicted in FIGS. 11 and 12, the bi-metal thermal shield 60 includes a single tube 114 (e.g., inner tube) configured to be coupled to a pair of thermal shield flanges 150 (e.g., only a single flange 150 is shown in FIG. 11) on the longitudinal ends 120, 122 of the tube 114. The tube 114 is configured to be disposed about the cold mass of the superconducting magnet. As depicted, an innermost surface 132 of the tube 114 is made of the more mechanically stiff layer (e.g., metal layer 82 in FIG. 3 made of stainless steel or titanium) and the outermost surface 134 of the tube 114 is made of the more thermally conductive layer (e.g., metal layer 80 in FIG. 3 made of copper or aluminum). The thermal shield flange 160 includes circumferentially spaced (e.g. relative to a longitudinal axis of the tube 114) axial fins 162 that form a connector 164 to couple the thermal shield flange 160 to the tube 114. The thermal shield flange 160 and the axial fins 162 of the connector 164 are made of a thermally conductive material such as aluminum.

Figure 13:
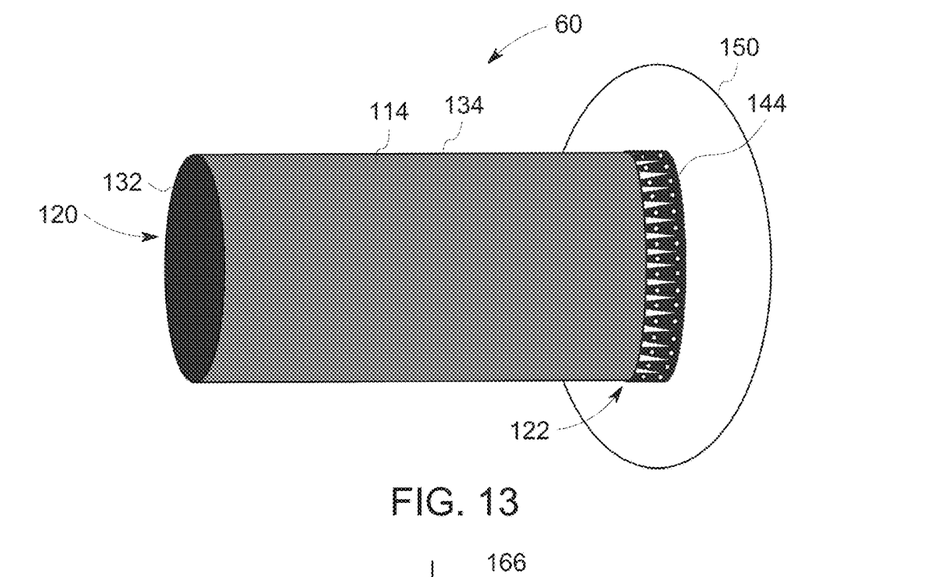
FIG. 13 is a perspective view of the portion the bi-metal thermal shield of FIG. 11 (e.g., having a connector of thermal shield flange to an inside of the tube), in accordance with aspects of the present disclosure.

The longitudinal ends 120, 122 may be coupled to the thermal shield flanges 160 in a couple of different arrangements. As depicted in FIG. 12, the axial fins 162 of the connector 164 are disposed about and coupled to the outermost surface 134 of the tube 114 at the longitudinal end 122. Similarly, another thermal shield flange 160 may be coupled at the longitudinal end 120 of the tube 114. As depicted in FIG. 13, the axial fins 162 of the connector 164 are disposed within and coupled to the innermost surface 132 of the tube 114 at the longitudinal end 122. Similarly, another thermal shield flange 160 may be coupled at the longitudinal end 120 of the tube 114. In both FIGS. 12 and 13, the axial fins 162 are coupled to the tube 114 via rivets or other fasteners 144 with Stycast2850FT epoxy or indium interfaces for thermal contact. As depicted in FIG. 13, the surface 134 is made of the more mechanically stiff layer (e.g., metal layer 82 in FIG. 3 made of stainless steel or titanium) and the surface 132 made of the more thermally conductive layer (e.g., metal layer 80 in FIG. 3 made of copper or aluminum).

Figure 14:
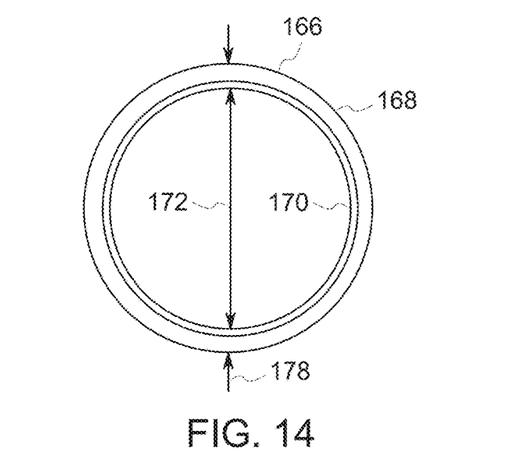
FIG. 14 is a front view of an adaptor ring for connecting a tube to a thermal shield flange, in accordance with aspects of the present disclosure.
Figure 15:
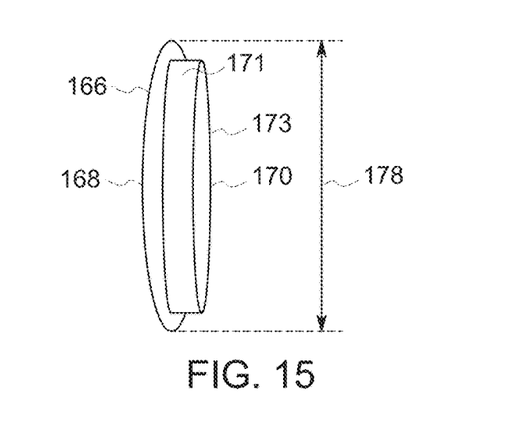
FIG. 15 is a perspective side view of the adaptor ring of FIG. 14, in accordance with aspects of the present disclosure.
Figure 16:
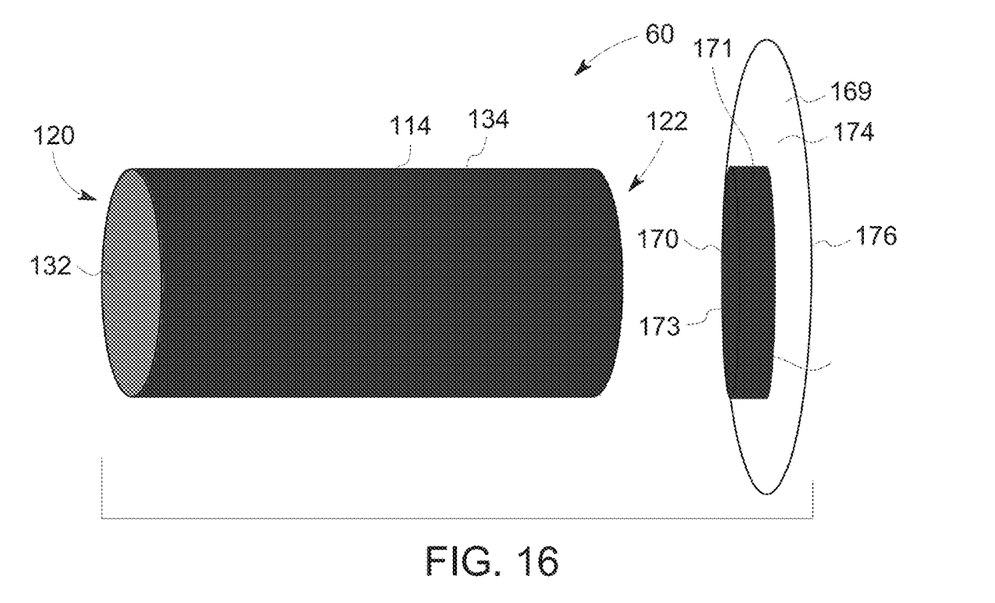
FIG. 16 is a perspective view of a tube and a thermal shield flange coupled to the adaptor ring of FIG. 14, in accordance with aspects of the present disclosure.

FIGS. 14 and 15 are different views of an adaptor ring 166 (e.g., preformed adaptor ring) for connecting the tube 114 (e.g., bi-metal tube) to thermal shield flanges to form the bi-metal thermal shield 60. FIG. 16 is a perspective view of the tube 114 and a thermal shield flange 169 coupled to the adaptor ring 166. The adaptor ring 166 may be made of a thermally conductive material such as aluminum or copper. The adaptor ring 166 includes a head portion 168 and an axial connector portion 170. The axial connector portion 170 is configured to be coupled to the tube 114. In certain embodiments, the axial connector portion 170 is configured to be inserted within the inner portion of the longitudinal end 122 of the tube 114 so that an outer surface 171 of the axial connection portion 170 interfaces with the innermost surface 132 of the tube 114. In this scenario, the innermost surface 132 of the tube 114 and the adaptor ring 166 are made of the more thermally conductive layer (e.g., metal layer 80 in FIG. 3 made of copper or aluminum) and the outermost surface 134 of the tube 114 is made of the more mechanically stiff layer (e.g., metal layer 82 in FIG. 3 made of stainless steel or titanium). In certain embodiments, an inner surface 173 of the axial connector portion 170 is configured to be disposed about and interface with the outermost surface 134 of the longitudinal end 122 of the tube 114. In this scenario, the outermost surface 134 of the tube 114 and the adaptor ring 166 are made of the more thermally conductive layer (e.g., metal layer 80 in FIG. 3 made of copper or aluminum) and the innermost surface 132 of the tube 114 is made of the more mechanically stiff layer (e.g., metal layer 82 in FIG. 3 made of stainless steel or titanium) as depicted in FIG. 16. A diameter 172 of the axial connector portion 170 may vary depending on whether the axial connector portion 170 is configured to be disposed within or about the outside of the tube 114.

Prior to coupling the adaptor ring 166 to the tube 114, the adaptor ring 166 is coupled to the thermal shield flange 169 by inserting the axial connector portion 170 within a bore of the thermal shield flange 169. The axial connection portion 170 is disposed on a surface 174 of the thermal shield flange 169 facing the tube 114 and the head portion 168 is disposed on a surface 176 of the thermal shield flange 169 facing away from the tube 114. An outer diameter 178 of the head portion 169 is wider than the diameter 172 of the axial connector portion 170 and the bore of the thermal shield flange 169 to keep the adaptor ring 166 secure to the thermal shield flange 169. Thermal shield flanges 169 with adaptor rings 166 are coupled to both longitudinal ends 120, 122 of the tube 114.

Figure 17:
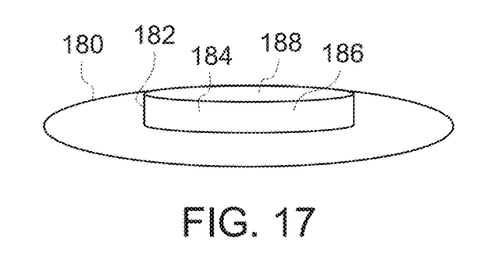
FIG. 17 is a perspective side view of a thermal shield flange with a welded adaptor ring in a horizontal orientation, in accordance with aspects of the present disclosure.
Figure 18:
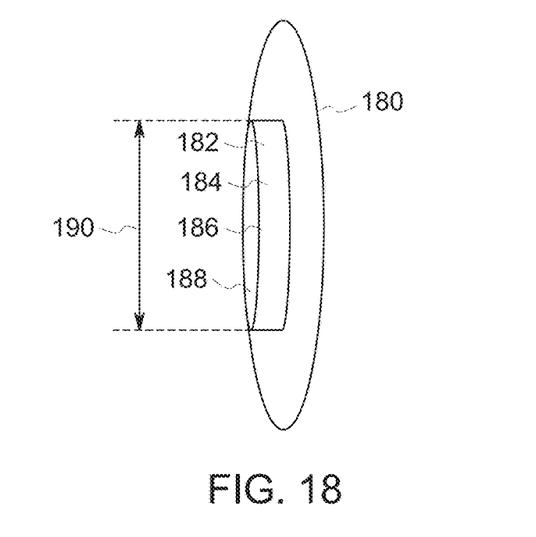
FIG. 18 is a perspective side view of the thermal shield flange of FIG. 17 in a vertical orientation, in accordance with aspects of the present disclosure.
Figure 19:
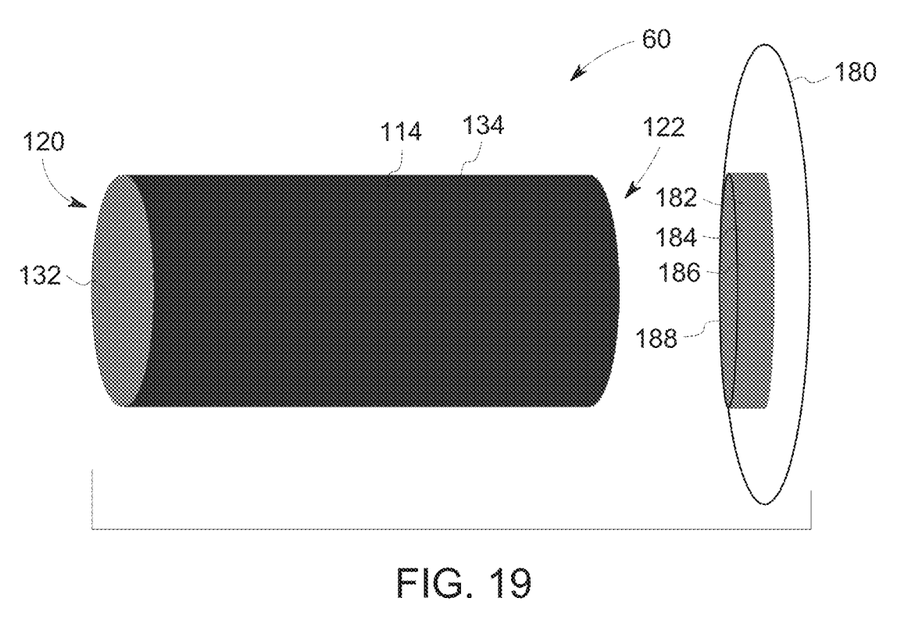
FIG. 19 is perspective view of a tube and the thermal shield flange of FIG. 17, in accordance with aspects of the present disclosure.

FIGS. 17 and 18 are different views of a thermal shield flange 180 with a welded adaptor ring 182 for connecting the tube 114 (e.g., bi-metal tube) to thermal shield flanges 180 to form the bi-metal thermal shield 60. FIG. 16 is a perspective view of the tube 114 and the thermal shield flange 180 with the welded adaptor ring 182. The adaptor ring 182 may be made of a thermally conductive material such as aluminum or copper. The adaptor ring 182 includes an axial connector portion 184. The axial connector portion 184 is configured to be coupled to the tube 114. In certain embodiments, the axial connector portion 184 is configured to be inserted within the inner portion of the longitudinal end 122 of the tube 114 so that an outer surface 186 of the axial connection portion 184 interfaces with the innermost surface 132 of the tube 114. In this scenario, the innermost surface 132 of the tube 114 and the adaptor ring 182 are made of the more thermally conductive layer (e.g., metal layer 80 in FIG. 3 made of copper or aluminum) and the outermost surface 134 of the tube 114 is made of the more mechanically stiff layer (e.g., metal layer 82 in FIG. 3 made of stainless steel or titanium). In certain embodiments, an inner surface 188 of the axial connector portion 184 is configured to be disposed about and interface with the outermost surface 134 of the longitudinal end 122 of the tube 114. In this scenario, the outermost surface 134 of the tube 114 and the adaptor ring 182 are made of the more thermally conductive layer (e.g., metal layer 80 in FIG. 3 made of copper or aluminum) and the innermost surface 132 of the tube 114 is made of the more mechanically stiff layer (e.g., metal layer 82 in FIG. 3 made of stainless steel or titanium) as depicted in FIG. 19. A diameter 190 of the axial connector portion 184 may vary depending on whether the axial connector portion 184 is configured to be disposed within or about the outside of the tube 114.

Technical effects of the disclosed subject matter include providing a bi-metal thermal shield configured to be disposed about a cold mass of a superconducting magnet of an MRI system to minimize MGI. The bi-metal thermal shield includes a first metal layer and a second metal layer made of different metal materials, wherein the first metal layer (e.g., aluminum or copper) is thermally more conductive than the second metal layer and the second metal layer (e.g., stainless steel or titanium) is mechanically stiffer than the first metal layer. The second metal layer is configured to minimize mechanical vibration in the thermal shield due to eddy current induction and to minimize heat generated in the cold mass of the superconducting magnet system. The disclosed bi-metal thermal shield keeps the magnet from overheating, thus, avoiding quenching (especially for high field MRI magnets (3 T or above)).

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

This written description uses examples to disclose the present subject matter, including the best mode, and also to enable any person skilled in the art to practice the subject matter, including making and using any devices or systems and performing any incorporated methods. The patentable scope of the subject matter is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A system for minimizing magnetic gradient interaction (MGI) in a superconducting magnet system of a magnetic resonance imaging system, comprising:
   a thermal shield having bi-metal material and configured to be disposed about a cold mass of the superconducting magnet system, wherein the bi-metal material is configured to minimize MGI, wherein the thermal shield comprises a plurality of metal layers, wherein at least two metal layers of the plurality of metal layers comprise different materials with different thermal and electrical properties, wherein the plurality of metal layers comprises a first metal layer, a second metal layer, and a third metal layer, and the second metal layer is disposed between and contacts both the first metal layer and the third metal layer, and wherein the first metal layer and the third metal layer are made of the same metal material, and wherein the second metal layer is made of different metal materials than both the first metal layer and the third metal layer, both the first metal layer and the third metal layer are mechanically stiffer than the second metal layer, and the second metal layer is more thermally conductive than both the first metal layer and the third metal layer.

2. The system of claim 1, wherein the second metal layer is made of aluminum or copper and both the first metal layer and the third metal layer are made of stainless steel or titanium.

3. The system of claim 1, wherein the first metal layer and the third metal layer are configured to minimize mechanical vibration in the thermal shield due to eddy current induction.

4. The system of claim 1, wherein first metal layer and the third metal layer are configured to minimize heat generated in the cold mass of the superconducting magnet system.

5. The system of claim 1, wherein the thermal shield comprises a pair of flanges and a tube disposed between the pair of flanges, wherein the tube is configured to be disposed about the cold mass.

6. The system of 5, wherein each flange of the pair of flanges comprises portions that are circumferentially spaced apart relative to a longitudinal axis of the tube, wherein the portions are made of the bi-metal material.

7. A superconducting magnet system for a magnetic resonance imaging system, comprising:
a cold mass, comprising:
a coil support structure having a body; and
a superconducting magnet having a superconducting coil disposed about the body of the coil support structure; and
a thermal shield encompassing the cold mass, wherein the thermal shield comprises a bi-metal material configured to minimize magnetic gradient interaction, wherein the thermal shield comprises a plurality of metal layers, wherein at least two metal layers of the plurality of metal layers comprise different materials with different thermal and electrical properties, wherein the plurality of metal layers comprises a first metal layer, a second metal layer, and a third metal layer, and the second metal layer is disposed between and contacts both the first metal layer and the third metal layer, and wherein the first metal layer and the third metal layer are made of the same metal material, the second metal layer is made of different metal materials than both the first metal layer and the third metal layer, both the first metal layer and the third metal layer are mechanically stiffer than the second metal layer, and the second metal layer is more thermally conductive than both the first metal layer and the third metal layer.

8. The superconducting magnet system of claim 7, comprising a vacuum vessel encompassing the cold mass, wherein the thermal shield is disposed between the vacuum vessel and the cold mass.

9. The superconducting magnet system of claim 7, wherein first metal layer and the third metal layer are configured to minimize mechanical vibration in the thermal shield due to eddy current induction.

10. The superconducting magnet system of claim 7, wherein first metal layer and the third metal layer are configured to minimize heat generated in the cold mass of the superconducting magnet system.

11. A magnetic resonance imaging (MRI) system, comprising:
a plurality of gradient coils; and
a superconducting magnet system, comprising:
a cold mass; and
a thermal shield encompassing the cold mass, wherein the thermal shield comprises a bi-metal material configured to minimize magnetic gradient interaction with the gradient coils, wherein the thermal shield comprises a plurality of metal layers, wherein at least two metal layers of the plurality of metal layers comprise different materials with different thermal and electrical properties, wherein the plurality of metal layers comprises a first metal layer, a second metal layer, and a third metal layer, and the second metal layer is disposed between and contacts both the first metal layer and the third metal layer, and wherein the first metal layer and the third metal layer are made of the same metal material, the second metal layer is made of different metal materials than both the first metal layer and the third metal layer, both the first metal layer and the third metal layer are mechanically stiffer than the second metal layer, and the second metal layer is more thermally conductive than both the first metal layer and the third metal layer.

* * * * *